(12) United States Patent
Liu et al.

(10) Patent No.: US 6,756,818 B1
(45) Date of Patent: Jun. 29, 2004

(54) VOLTAGE-CONTROLLED DELAY LINE WITH REDUCED TIMING ERRORS AND JITTERS

(75) Inventors: Shen-Iuan Liu, Taipei (TW); Chih-Hao Sun, Taipei Hsien (TW); Hsiang-Hui Chang, Tao-Yuan Hsien (TW)

(73) Assignee: Mediatek Incorporation, Hsin-Chu Hsien (TW)

( * ) Notice: Subject to any disclaimer, the term of this patent is extended or adjusted under 35 U.S.C. 154(b) by 0 days.

(21) Appl. No.: 10/250,171

(22) Filed: Jun. 10, 2003

(30) Foreign Application Priority Data

Dec. 9, 2002 (TW) .......................................... 91135601 A (51) Int. Cl.[7] .................................................. H03L 7/06
(52) U.S. Cl. .......................... 326/93; 327/158; 327/161; 327/237; 327/270
(58) Field of Search ........................... 326/93; 327/158, 327/161, 231, 237, 261, 270

(56) References Cited

U.S. PATENT DOCUMENTS

| | | | | |
|---|---|---|---|---|
| 5,970,110 A | * | 10/1999 | Li ................................ | 377/48 |
| 6,426,662 B1 | * | 7/2002 | Arcus .......................... | 327/295 |
| 6,492,851 B2 | * | 12/2002 | Watarai ....................... | 327/158 |

* cited by examiner

Primary Examiner—Daniel D. Chang
(74) Attorney, Agent, or Firm—Winston Hsu (57) ABSTRACT

A voltage controlled delay line having a plurality of delay cells is used to delay a first reference clock by a predetermined delay time to generate an in-phase first delay clock and to delay a second reference clock by the predetermined delay time to generate an in-phase second delay clock. Each delay cell has a first input port, a second input port, a first output port, and a second output port. The first output port of one delay cell and the second input port of another one delay cell having the same phase are electrically connected or the second output port of one delay cell and the first input port of another one delay cell having the same phase are electrically connected so that the first and second input port of each delay cell are not connected to the first and second output port of an adjacent delay cell.

10 Claims, 7 Drawing Sheets

VOLTAGE-CONTROLLED DELAY LINE WITH REDUCED TIMING ERRORS AND JITTERS

BACKGROUND OF INVENTION

1. Field of the Invention

The present invention relates to a voltage-controlled delay line. More specifically, the present invention discloses a voltage-controlled delay line with an improved interconnection among delay cells for reducing timing errors and jitters.

2. Description of the Prior Art

Processing, exchanging, and distributing digital information exists in a broad spectrum of fields. For example, digital devices such as mobile phones, personal digital assistants (PDAs), information applicants (IAS) that are connected to a computer network, and personal computers are utilized to conveniently handle digital information. When the digital device processes, exchanges, and distributes digital information, the digital device requires triggers generated from a clock signal to process digital data that are sequentially transmitted. For instance, a central processing unit (CPU) of a personal computer coordinates data transmitted among digital circuits and data processed among the digital circuits with the help of triggers generated from a clock signal. In addition, with regard to a mobile phone, a clock signal is necessary to let the mobile phone correctly transmit and receive wireless signals. Suppose that the mobile phone functions as a receiver to receive incoming digital signals. In the beginning, the mobile phone has to establish a local clock signal synchronized with a timing associated with the incoming digital signals outputted from a base station. Therefore, the mobile phone successfully transmits wireless signals to the base station and correctly receives wireless signals outputted from the base station according to the local clock signal synchronized with clock signal used by the base station.

During a digital information processing procedure triggered by clock signals, a well-known technique for generating a synchronous clock signal based on a reference clock signal is widely adopted. In digital circuits, a frequency associated with one of two synchronous clock signals is multiplied or divided to further obtain two synchronous clock signals with different frequencies for conveniently handling digital data. In addition, it is possible to generate a synchronous clock signal with a greater driving capacity according to a reference clock signal. With regard to a digital mobile communication system, when a mobile phone, which functions as a receiver, needs to establish a local clock signal according to timing of received signals, the received signals have weak amplitudes so that the driving capacity of the received signals is poor. Therefore, a synchronous clock having a greater driving capacity and corresponding to timing of received signals is necessary to drive the mobile phone to work properly.

A circuit, which is capable of generating a synchronous clock signal according to a reference clock signal, is called a phase lock loop (PLL). One embodiment of the prior art PLL is a so-called delay lock loop (DLL). Please refer to FIG. 1, which is block diagram of a prior art DLL 10. The DLL 10 has a clock generator 11, a voltage-controlled delay line 12, a phase detector 14, a charge pump 16, and two differential-to-single-ended converters 18a, 18b. The generator 11 simultaneously outputs a first reference clock signal CLK_REF+ and a second reference clock signal CLK_REF−, where a phase difference between the first reference clock signal CLK_REF+ and the second reference clock signal CLK_REF− is equal to 180 degrees. That is, the first reference clock signal CLK_REF+ and the second reference clock signal CLK_REF− are out of phase. The voltage-controlled delay line 12, therefore, respectively delays the first reference clock signal CLK_REF+ and the second reference clock signal CLK_REF− to generate a first delay clock signal CLK_DL+ and a second delay clock signal CLK_DL−. The differential-to-signal-ended converter 18a outputs a first comparison signal CLK1 based on a magnitude difference between the first reference clock signal CLK_REF+ and the second reference clock signal CLK_REF−. A period of the first comparison signal CLK1 is identical to a period of the first reference clock signal CLK_REF+, and the period of the first comparison signal CLK1 is identical to a period of the second reference clock signal CLK_REF− as well. Similarly, the differential-to-single-ended converter 18b outputs a second comparison signal CLK2 based on a magnitude difference between the first delay clock signal CLK_DL+ and the second delay clock signal CLK_DL−.

Figure 1:
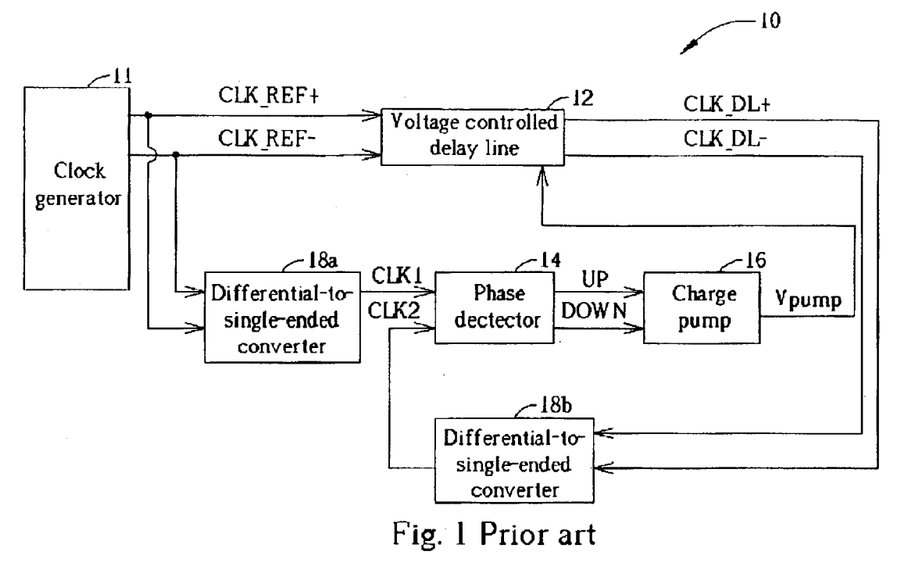
FIG. 1 is block diagram of a prior art delay lock loop.

A period of the second comparison signal CLK2 is theoretically identical to a period of the first delay clock signal CLK_DL+, and the period of the second comparison signal CLK2 is identical to a period of the second delay clock signal CLK_DL− as well. Then, the phase detector 14 judges if the first delay clock signal CLK_DL+ and the first reference clock signal CLK_REF+ are in phase according to phases of the first comparison signal CLK1 and the second comparison signal CLK2. In addition, the phase detector 14 also judges if the second delay clock signal CLK_DL− and the second reference clock signal CLK_REF− are in phase according to phases of the first comparison signal CLK1 and the second comparison signal CLK2. When either rising edges or falling edges of the first delay clock signal CLK_DL+ and the first reference clock signal CLK_REF+ differ by an integral multiple of the period of first reference clock signal CLK_REF+, the first delay clock signal CLK_DL+ and the first reference clock signal CLK_REF+ are in phase. Similarly, when either rising edges or falling edges of the second delay clock signal CLK_DL− and the second reference clock signal CLK_REF− differ by an integral multiple of the period of second reference clock signal CLK_REF−, the second delay clock signal CLK_DL− and the second reference clock signal CLK_REF− are in phase.

After the phase detector 14 compares phases of the first reference clock signal CLK1 and the second reference clock signal CLK2, the phase detector 14 outputs control signals UP, DOWN to the charge pump 16 according to the reference clock signal CLK1 leading the second reference clock signal CLK2 or the reference clock signal CLK1 lagging the second reference clock signal CLK2. After the charge pump 16 receives the control signal DOWN, the charge pump 16 raises voltage level of a control voltage Vpump. With regard to voltage-controlled delay line 12, the increased control voltage Vpump drives the voltage-controlled delay line 12 to delay the first reference clock signal CLK_REF+ and the second reference clock signal CLK_REF− through a longer delay time. On the other hand, after the charge pump 16 receives the control signal UP, the charge pump 16 lowers voltage level of the control voltage Vpump. With regard to voltage-controlled delay line 12, the decreased control voltage Vpump drives the voltage-controlled delay line 12 to delay the first reference clock signal CLK_REF+ and the second reference clock signal CLK_REF− through a shorter delay time.

Figure 2:
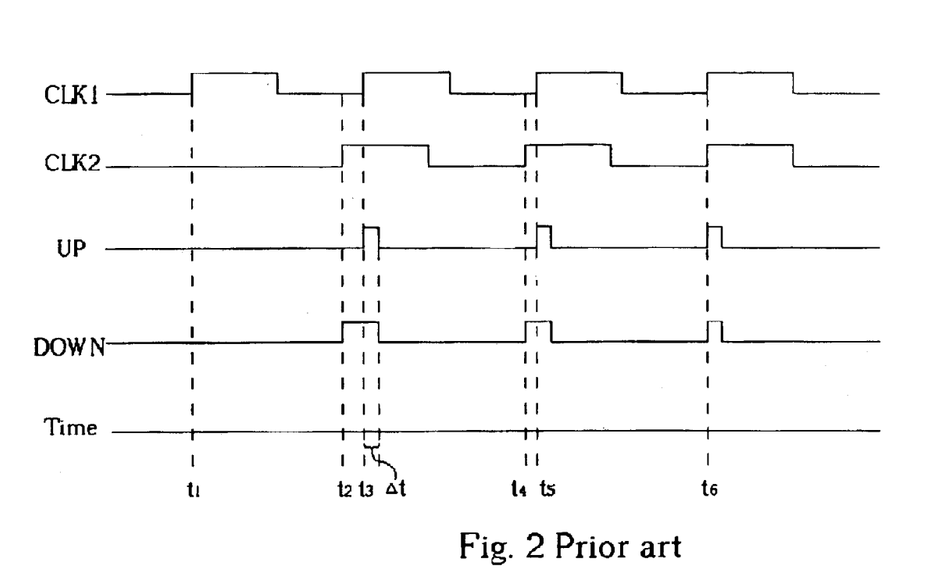
FIG. 2 is a first timing diagram illustrating a phase lock process.
Figure 3:
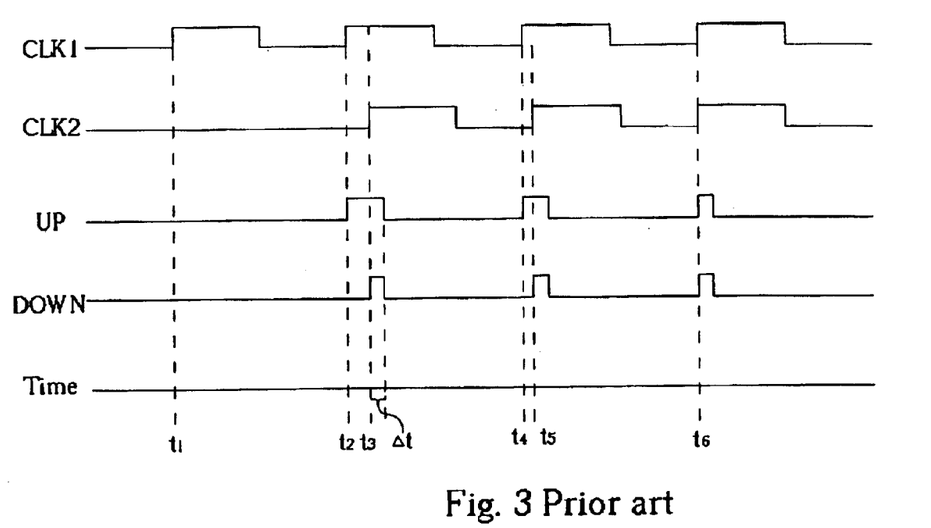
FIG. 3 is a second timing diagram illustrating the phase lock process.

Please refer to FIG. 2 and FIG. 3. FIG. 2 is a first timing diagram illustrating a phase lock process, and FIG. 3 is a second timing diagram illustrating the phase lock process. Within FIG. 2 and FIG. 3, the waveforms from top to bottom respectively represent the first comparison signal CLK1, the second comparison signal CLK2, the control signal UP, the control signal DOWN, and time. For example, the first reference clock signal CLK_REF+ and the second reference clock signal CLK_REF−, which correspond to the first comparison clock CLK1, are inputted into the voltage-controlled delay line 12 at time t1. The voltage-controlled delay line 12 outputs the first delay clock signal CLK_DL+ and the second delay clock CLK_DL−, which correspond to the second comparison signal CLK2, after a delay time (t2−t1).

As shown in FIG. 2, the rising edge of the second comparison clock CLK2 at time t2 leads the rising edge of the first comparison signal CLK1 at time t3. That is, the phase of the second comparison signal CLK2 leads the phase of the first comparison signal CLK1. In other words, the delay time (t2−t1) introduced by the voltage-controlled delay line 12 is less than the period (t3−t1) corresponding to the first reference clock signal CLK_REF+ and the second reference clock signal CLK_REF−. Therefore, the currently adopted delay time should be increased. Therefore, the phase detector 14 outputs the control signal DOWN at time t2 to the charge pump 16 for raising the control voltage Vpump.

The first comparison signal CLK1 forms a rising edge at time t3. At the same time, the control signal UP is issued by the phase detector 14 during an interval Î□. While the phase detector 14 resets the control signal UP, the control signal DOWN is reset as well. Therefore, the control signal UP and the control signal DOWN are both reset at time t3+Î□. As shown in FIG. 2, the delay time is now adjusted to be (t4−t3). Because the rising edge of the second comparison signal CLK2 at time t4 still leads the rising edge of the first comparison signal CLK1 at time t5, the phase detector 14 outputs the control signal DOWN at time t4 to the charge pump 16.

When the first comparison signal CLK1 generates the rising edge at time t5, the phase detector 14 outputs the control signal UP during the interval Î□. Then, the control signal UP and the control signal DOWN are both reset at time t5+Î□. The first comparison signal CLK1 and the second comparison signal CLK2 are in phase at time t6. That is, the first comparison signal CLK1 and the second comparison signal CLK2 form rising edges simultaneously at time t6. Therefore, the phase detector 14 outputs the control signals UP, DOWN to the charge pump 16 during the same interval Î□. In other words, the control signals UP, DOWN are both reset at time t6+Î□.

Because the both control signals UP, DOWN have the same power to affect the control voltage Vpump, the charge pump 16 therefore holds currently adopted control voltage Vpump without being altered to drive the voltage-controlled delay line 12 for locking the first and second reference clock signals CLK_REF+, CLK_REF− and the in phase first and second delay clock signals CLK_DL+, CLK_DL− corresponding to the first and second reference clock signals CLK_REF+, CLK_REF−.

Please refer to FIG. 3, the first reference clock signal CLK_REF+ and the second reference clock signal CLK_REF−, which correspond to the first comparison clock CLK1, are inputted into the voltage-controlled delay line 12 at time t1. The voltage-controlled delay line 12 outputs the first delay clock signal CLK_DL+ and the second delay clock CLK_DL−, which correspond to the second comparison signal CLK2, after a delay time (t2−t1). As shown in FIG. 3, the rising edge of the second comparison clock CLK2 at time t3 lags the rising edge of the first comparison signal. CLK1 at time t2. That is, phase of the second comparison signal CLK2 lags phase of the first comparison signal CLK1. In other words, the delay time (t3−t1) introduced by the voltage-controlled delay line 12 is greater than the period (t2−t1) corresponding to the first reference clock signal CLK_REF+ and the second reference clock signal CLK_REF−. Therefore, the currently adopted delay time should be cut down. Therefore, the phase detector 14 outputs the control signal UP at time t2 to the charge pump 16 for decreasing the control voltage Vpump.

The second comparison signal CLK1 forms a rising edge at time t3. At the same time, the control signal DOWN is issued by the phase detector 14 during an interval Î□. While the phase detector 14 resets the control signal DOWN, the control signal UP is reset as well. Therefore, the control signal UP and the control signal DOWN are both simultaneously reset at time t3+Î□. As shown in FIG. 3, the delay time is now adjusted to be (t5−t2). Because the rising edge of the second comparison signal CLK2 at time t5 still lags the rising edge of the first comparison signal CLK1 at time t4, the phase detector 14 outputs the control signal UP at time t4 to the charge pump 16. When the second comparison signal CLK2 generates the rising edge at time t5, the detector 14 outputs the control signal DOWN during the interval Î□. Then, the control signal UP and the control signal DOWN are both reset at time t5+Î□.

The first comparison signal CLK1 and the second comparison signal CLK2 are in phase at time t6. That is, the first comparison signal CLK1 and the second comparison signal CLK2 form rising edges simultaneously at time t6. Therefore, the phase detector 14 outputs the control signals UP, DOWN to the charge pump 16 during the same interval Î□. In other words, the control signals UP, DOWN are both reset at time t6+Î□.

Because the both control signals UP, DOWN have the same power to affect the control voltage Vpump, the charge pump 16, therefore, holds currently adopted control voltage Vpump without being altered to drive the voltage-controlled delay line 12 for locking the first and second reference clock signals CLK_REF+, CLK_REF− and the in phase first and second delay clock signals CLK_DL+, CLK_DL− corresponding to the first and second reference clock signals CLK_REF+, CLK_REF−.

Figure 4:
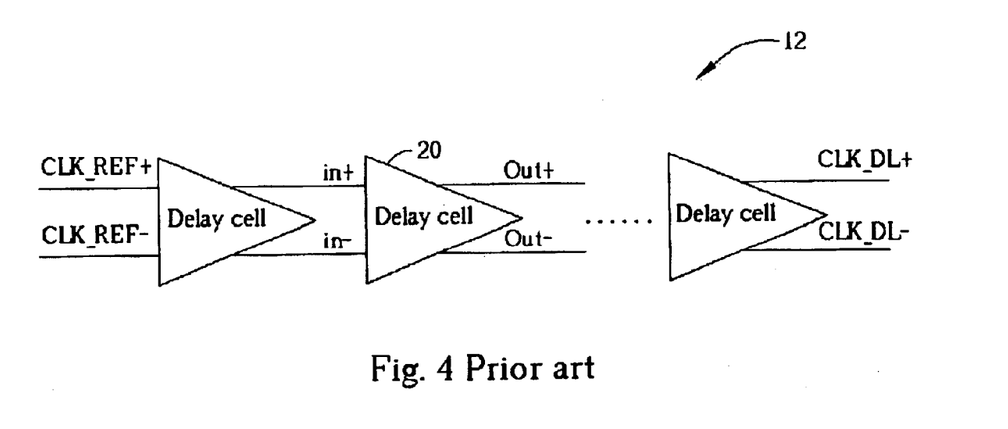
FIG. 4 is a diagram of a voltage-controlled delay line shown in FIG. 1.
Figure 5:
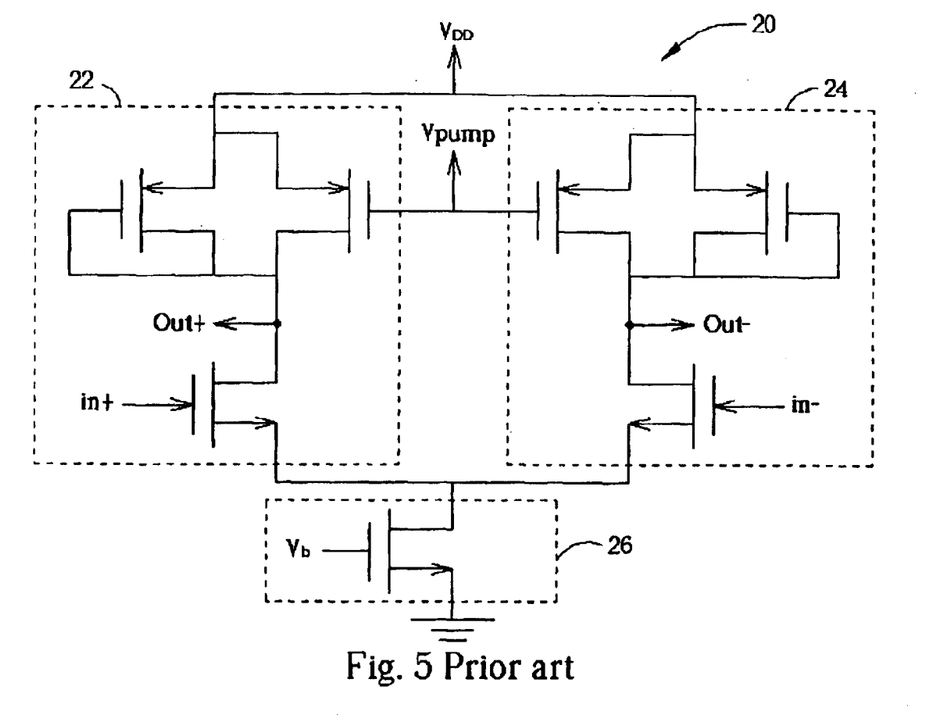
FIG. 5 is a circuit diagram of a delay cell shown in FIG. 4.

Please refer to FIG. 4 and FIG. 5. FIG. 4 is a diagram of the voltage-controlled delay line 12 shown in FIG. 1, and FIG. 5 is a circuit diagram of a delay cell 20 shown in FIG. 4. The voltage-controlled delay line 12 has a plurality of delay cells 20 that are cascaded in series. An output port out+ of a delay cell 20 is electrically connected to an input port in+ of a following delay cell. Similarly, an output port out− of a delay cell 20 is electrically connected to an input port in− of a following delay cell. As shown in FIG. 5, the delay cell 20 corresponds to a symmetrical circuit structure, and has a first circuit 22, a second circuit 24, and a current source 26. A voltage Vb is used to control current value provided by the current source 26, and the control voltage Vpump outputted from the charge pump 16 is used to control current values corresponding to the first circuit 22 and the second circuit 24. However, with development of the semiconductor process, the size of chips have become smaller. Therefore, the circuits formed on the same chip are much closer together than before. With regard to the deep sub-micro process, one circuit component might easily affect another circuit component.

For the first circuit 22 and the second circuit 24, operational characteristics of both circuits are mismatched owing to the advanced semiconductor process. That is, when the same control voltage Vpump is inputted to the delay cell 20, the first circuit 22 and the second circuit 24 generate different voltage variations so that currents passing through the first circuit 22 and the second circuit 24 differ. Not only is the delay time associated with the input port in+ and the output port out+ different from the delay time associated with the input port in− and the output port out−, but the phase difference between the input port in+ and the output port out+ and the phase difference between the input port in− and the output port out− both deviate from a predetermined value. For instance, if the voltage-controlled delay line 12 has ten delay cells 20, and the input port and the corresponding output port of each delay cell 20 corresponds to a delay time Td. The voltage-controlled delay line 12 has a delay cell 20 with mismatched first and second circuits 22, 24. Therefore, with regard to the first circuit 22, the corresponding delay time becomes Td+dT instead. On the other hand, the delay time of the second circuit 24 then becomes Td−dT owing to the above-mentioned symmetrical circuit structure.

It is shown in FIG. 4 that the voltage-controlled delay line 12 delays the first reference clock signal CLK_REF+ by a total delay time 10*Td+dT for outputting the first delay clock signal CLK_DL+. However, the voltage-controlled delay line 12 delays the second reference clock signal CLK_REF− by a total delay time 10*Td−dT for outputting the second delay clock signal CLK_DL−. It is obvious that each delay cell having mismatched first and second circuits 22, 24 corresponds to a specific degree of influence upon the associated delay time. In the end, problems with respect to timing errors between the first and second reference clock signals CLK_REF+, CLK_REF− and the first and second delay clock signals CLK_DL+, CLK_DL− are introduced.

At the same time, the timing errors certainly cause the periods corresponding to the delay clock signals CLK_DL+, CLK_DL− to change continuously. Therefore, the jitters corresponding to the delay clock signals CLK_DL+, CLK_DL− are great. If the component size is increased to prevent the above-mentioned mismatch problem when utilizing the deep sub-micro process to manufacture the DLL 10, the chip size increases and the related parasite capacitance increases owing to an enlarged trace width. However, if an additional calibration circuit is utilized to solve the above-mentioned mismatch problem without increasing component size, the hardware complexity will increase to raise an overall product cost.

SUMMARY OF INVENTION

It is therefore a primary objective of this invention to provide a voltage-controlled delay line capable of reducing timing errors and jitters.

Briefly summarized, the preferred embodiment of the claimed invention discloses a voltage-controlled delay line. The voltage-controlled delay line includes a clock generator for generating a first reference clock signal and a second reference clock signal, and a voltage-controlled delay line for delaying the first reference clock signal by a predetermined delay time to generate a first delay clock signal and delaying the second reference clock signal by the predetermined delay time to generate a second delay clock signal. The first reference clock signal and the first delay clock signal are in phase and the second reference clock signal and the second delay clock signal are in phase.

The voltage-controlled delay line includes a plurality of delay cells, and each delay cell has a first input port, a second input port, a first output port, and a second output port. The delay cells include a first delay cell, a second delay cell, a third delay cell, and a fourth delay cell. A first input port of the first delay cell is electrically connected to the clock generator for receiving the first reference clock signal. A first input port of the second delay cell is electrically connected to a first output port of the first delay cell through a first input port and a first output port of at least a fifth delay cell. A first output port of the second delay cell is electrically connected to a second input port of the first delay cell. A second input port of the second delay cell is electrically connected to a second output port of the first delay cell through a first input port and a first output port of at least a sixth delay cell and a second input port and a second output port of at least a fifth delay cell. A first input port of the third delay cell is electrically connected to the clock generator for receiving the second reference clock signal a second input port of the third delay cell electrically connected to a second output port of the second delay cell. A first input port of the fourth delay cell is electrically connected to a first output port of the third delay cell through a second output port and a second input port of at least a fifth delay cell and a first output port and a first input port of at least a sixth delay cell. A second input port of the fourth delay cell is electrically connected to a second output port of the third delay cell through a second input port and a second output port of at least a sixth delay cell. A first output port of the fourth delay cell is used for outputting the first delay clock signal. A second output port of the fourth delay cell is used for outputting the second delay clock signal. In addition, a total amount of the fifth delay cells is equal to a total amount of the sixth delay cells.

It is an advantage of the claimed invention that the claimed voltage-controlled delay line either connects a first output port of one delay cell and a second input port of another delay cell where the first output port of one delay cell and the second input port of another delay cell correspond to the same phase, or connects a first input port of one delay cell and a second output port of another delay cell where the first output port of one delay cell and the second input port of another delay cell correspond to the same phase. In other words, the first and second input ports of a delay cell are not simultaneously connected to the corresponding first and second output ports of an adjacent delay cell. Therefore, the timing errors associated with adjacent delay cells are independent so that the timing errors and the corresponding jitters are reduced.

These and other objectives of the present invention will no doubt become obvious to those of ordinary skill in the art after reading the following detailed description of the preferred embodiment, which is illustrated in the various figures and drawings.

DETAILED DESCRIPTION

Figure 6:
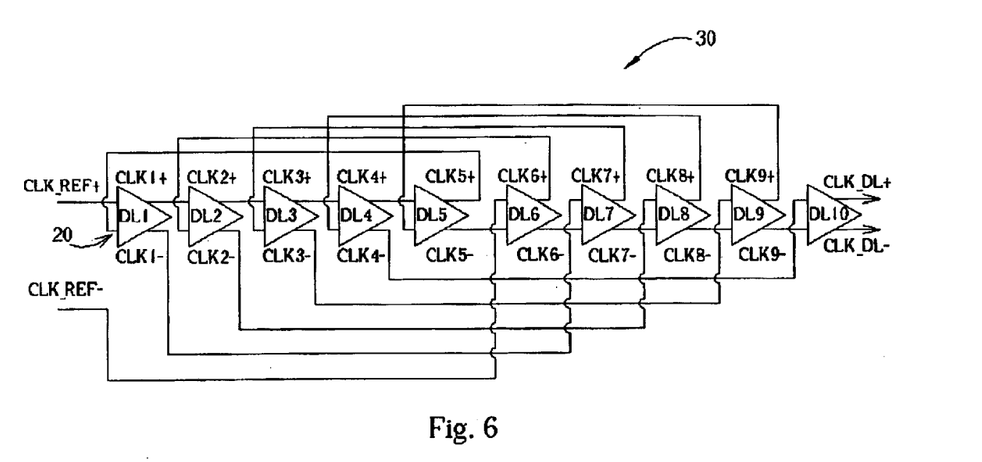
FIG. 6 is a diagram of a voltage-controlled delay line according to the present invention.
Figure 7:
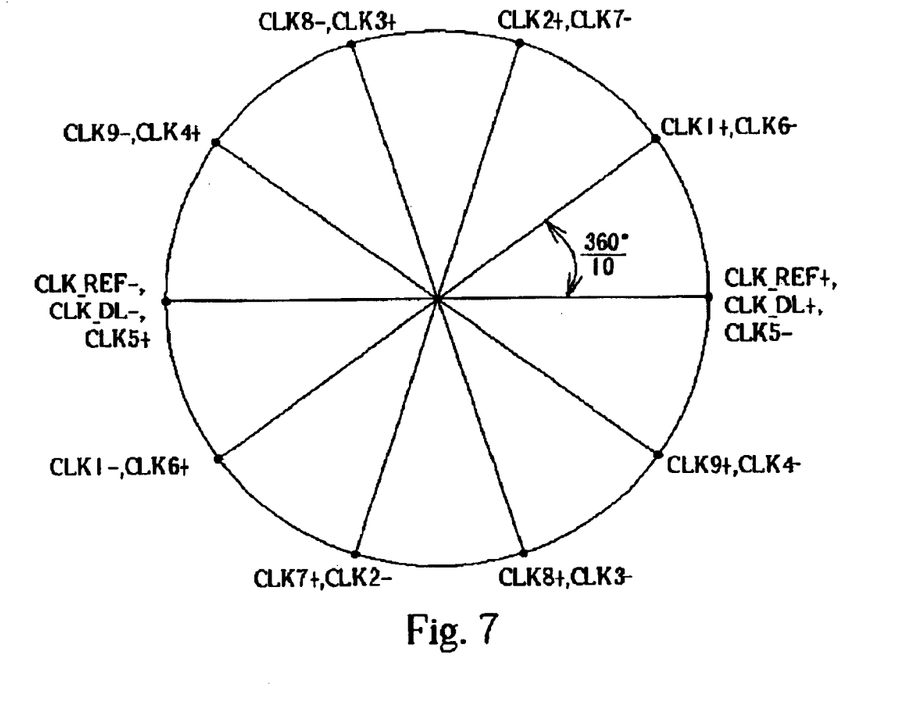
FIG. 7 is a phase diagram of output signals generated from delay cells shown in FIG. 6.

Please refer to FIG. 6 and FIG. 7. FIG. 6 is a diagram of a voltage-controlled delay line 30 according to the present invention, and FIG. 7 is a phase diagram of output signals generated from delay cells 20 shown in FIG. 6. The voltage-controlled delay line 30 includes a plurality of delay cells 20. Please note that the delay cell 20 on the preferred embodiment has a circuit structure identical to the circuit structure shown in FIG. 5. In addition, in order to describe conveniently features of the present invention, the voltage-controlled delay line 30 in the preferred embodiment only has delay cells whose amount corresponds to an even number such as ten. That is, ten delay cells DL1~DL10 within the voltage-controlled delay line 30 are used to illustrate functionality of the voltage-controlled delay line 30.

As mentioned above, the voltage-controlled delay line 30 is primarily used to delay the first reference clock signal CLK_REF+ to output the first delay clock signal CLK_DL+ where the first reference clock signal CLK_REF+ and the first delay clock signal CLK_DL+ are in phase. In other words, the rising edge of the first delay clock signal CLK_DL+ is synchronized with the rising edge of the first reference clock signal CLK_REF+. Therefore, an interval between the rising edge of the first delay clock signal CLK_DL+ and the rising edge of the first reference clock signal CLK_REF+ is equal to an integralmultiple of the period of the first reference clock signal CLK_REF+. The first reference clock signal CLK_REF+ and the second reference clock signal CLK_REF− are out of phase so that phase of the first reference clock signal CLK_REF+ and phase of the second reference clock signal CLK_REF− differs by 180 degrees.

Similarly, the voltage-controlled delay line 30 also delays the second reference clock signal CLK_REF− to output the second delay clock signal CLK_DL− where the second reference clock signal CLK_REF− and the second delay clock signal CLK_DL− are in phase. In other words, the rising edge of the second delay clock signal CLK_DL− is synchronized with the rising edge of the second reference clock signal CLK_REF−. Therefore, an interval between the rising edge of the second delay clock signal CLK_DL− and the rising edge of the second reference clock signal CLK_REF− is equal to an integralmultiple of the period of the second reference clock signal CLK_REF−. It is noteworthy that period of the first reference clock signal CLK_REF+ is equal to period of the second reference clock signal CLK_REF−.

The following description associated with the preferred embodiment describes the voltage-controlled delay line 30 locking one period T of the first reference clock signal CLK_REF+. Therefore, each of the delay cells DL1~DL10 corresponds to a delay time (1/10)*T. From the viewpoint of the phase relationship, each delay cell DL1~DL10 makes an output signal and an input signal correspond to a phase difference (360 Å°/10). It is known that the first reference clock signal CLK_REF+ and the first delay clock signal CLK_DL+ are in phase. As shown in FIG. 7, when the first reference clock signal CLK_REF+ corresponds to phase 0 Å°, the first delay clock signal CLK_DL+ corresponds to phase 0 Å° as well. Each of the delay cells DL1~DL10 corresponds to the phase difference (360 Å°/10) when processing the first reference clock signal CLK_REF+. Therefore, output signals CLK1+~CLK9+ outputted from delay cells DL1~DL9 counterclockwise divide the 360 degrees associated with one period T, and the distribution result of the output signals CLK1+~CLK9+ is shown in FIG. 7.

The first reference clock signal CLK_REF+ and the second reference clock signal CLK_REF− are out of phase so that the phase difference between the first reference clock signal CLK_REF+ and the second reference clock signal CLK_REF− is equal to 180 degrees. Therefore, when the first reference clock signal CLK_REF+ corresponds to 0 Å°, the second reference clock signal CLK_REF− then corresponds to 180 Å°. Similarly, the output signals CLK1−~CLK9− outputted from delay cells DL1~DL9 counterclockwise divide the 360 degrees associated with one period T, and the distribution result of the output signals CLK1−~CLK9− is shown in FIG. 7. It is obvious that one phase corresponds to different output signals. For instance, the output signal CLK1− generated from the delay cell DL1 and the output signal CLK6+ generated from the delay cell DL6 are in phase. In other words, the output signal CLK1− and output signal CLK6+ are capable of substituting for each other without affecting functionality of the voltage-controlled delay line 30.

In the preferred embodiment, the output signal CLK1− is used to the output signal CLK6+ outputted from the delay cell DL6 for driving the next delay cell DL7, and the output signal CLK6+ is then used to replace the output signal CLK1− generated from the delay cell DL1 for driving the next delay cell DL2. Similarly, each group of the output signals CLK2−, CLK7+, the output signals CLK3−, CLK8+, and the output signals CLK4−, CLK9+ corresponds to the same substitution rule mentioned above to establish the interconnection within the voltage-controlled delay line 30 shown in FIG. 6.

It is noteworthy that the total amount of delay cells 20 needs to equal an even number in order to make output signals correspond to the phase relation shown in FIG. 7. In other words, any phase shown in FIG. 7 is capable of corresponding to a plurality of output signals. In addition, the voltage-controlled delay line 30 shown in FIG. 6 is a preferred embodiment where the above-mentioned substitution rule is applied to each group of the output signals CLK1−, CLK6+, output signals CLK2−, CLK7+, output signals CLK3−, CLK8+, and output signals CLK4−, CLK9+. However, based on the phase relation shown in FIG. 7, different output signals corresponding to the same phase (the output signals CLK2−, CLK7+ for example) can substitute for each other to adjust interconnection between delay cells 20 within the prior art voltage-controlled delay line 12 shown in FIG. 4.

Operation of the voltage-controlled delay line 30 is described as follows. As shown in FIG. 4, it is obvious that the first circuit 22 and the second circuit 24 are symmetrical and are electrically connected to the same current source 26. For example, if one delay time is equal to Td+Î another delay time is certainly equal to Td-Î owing to the symmetrical circuit structure. On the other hand, if one delay time is equal to TD-Î another delay time is certainly equal to Td+Î owing to the symmetrical circuit structure. That is, when output port out+ and input port in+ in each of the delay cells DL1~DL10 correspond to a delay time TdÂ±Î output port out– and input port in– in each of the delay cells DL1~DL10 will correspond to a delay time Td–Î.

Suppose that an ideal delay time for each of the delay cells DL1~DL10 is equal to Td. However, if at least one delay cell (delay cell DL1 for example) has the above-mentioned mismatch problem, the corresponding delay times become Td±Î1 and Td Î1 that deviate from the ideal delay time Td. Please note that only the delay cell DL1 with the deviation ±Î1 is used to illustrate operation of the claimed voltage-controlled delay line 30 for simplicity. However, each of the delay cells DL1~DL10 actually has a corresponding deviation owing to its own mismatched circuit structure.

After the first reference clock signal CLK_REF+ is inputted into the delay cell DL1, the delay cell DL1 imposes the delay time Td±Î1 on the first reference clock signal CLK_REF+ to generate the output signal CLK1+ that is then transmitted to the next delay cell DL2. With the contribution of the delay cell DL2, the total delay time for the first reference clock signal CLK_REF+ becomes 2Td±Î1. Similarly, with the help of the following delay cells DL3, DL4, DL5, the total delay time for the first reference clock signal CLK_REF+ becomes 5Td±Î1. Please note that output signal CLK5+ of the delay cell DL5 is substituted for the second reference clock signal CLK_REF–, and the output signal CLK5+ is then inputted into the delay cell DL1. Therefore, the total delay time imposed on the first reference clock signal CLK_REF+ becomes 6Td, that is, 5Td±Î1+TdÎ1. At the same time, output signal CLK1– of the delay cell DL1 substitutes the output signal CLK6+ of the delay cell DL6, and is transmitted to the delay cell DL7. Therefore, with contribution of the delay cell DL7, the total delay time becomes 7Td. Based on the circuit structure shown in FIG. 6, the delay cells DL1, DL2, DL3, DL4, DL5, DL1, DL7, DL3, DL9, DL5, DL6 DL7, DL8, DL9, DL10 are sequentially activated to delay the first reference clock signal CLK_REF+ for generating the second delay clock signal CLK_DL–.

It is obvious that the total delay time imposed on the first reference clock signal CLK_REF+ is equal to 15Td. Therefore, the simultaneously introduced deviations +Î1 and –Î1 owing to the mismatched circuit structure inside the delay cell DL1 are automatically cancelled during the whole delay process for generating the second delay clock signal CLK_DL–. In addition, after the second reference clock signal CLK_REF– is inputted into the delay cell DL6, the delay cells DL6, DL2, DL8, DL4, DL10 are sequentially activated to delay the second reference clock signal CLK_REF– for generating the first delay clock signal CLK_DL+ according to the circuit structure shown in FIG. 6. Therefore, when the first delay clock signal CLK_DL+ is outputted, the total delay time corresponding to the first delay clock signal CLK_DL+ is equal to 5Td.

With regard to timing errors caused by the symmetrical circuit structure within each of the delay cells DL1~DL10 of the voltage-controlled delay line 30, each of the delay cells DL1~DL10 in the preferred embodiment is not sequentially activated to delay received signals. The preferred embodiment alters interconnection among the delay cells DL1~DL10 in the prior art voltage-controlled delay line 12 to adjust the prior art execution sequence associated with the delay cells DL1~DL10 in the prior art voltage-controlled delay line 12. According to the phase relation shown in FIG. 7, the output signals corresponding to the same phase can substitute each other to further average timing errors such as +Î1 and –Î1 so the timing errors affecting the voltage-controlled delay line 30 are greatly reduced.

Within the prior art voltage-controlled delay line 12 shown in FIG. 4, the delay cells DL1~DL10 are cascaded in series. In other words, one delay cell generates a timing error, and directly introduces the timing error to the next delay cell for superposing the timing error on the timing error of the next delay cell. Therefore, the timing errors associated with adjacent delay cells are dependent. However, within the claimed voltage-controlled delay line 30, two input ports in+, in– of one delay cell are electrically connected to output ports out+, out– respectively belonging to different delay cells. Taking the delay cell DL2 shown in FIG. 6 for example, one input port is electrically connected to one output port of the delay cell DL1, but another input port of the delay cell DL2 is electrically connected to output port of the delay cell DL6. In other words, the timing errors of adjacent delay cells are independent.

According to H. Gian, R. Raf, "A 65-mW, 10-bit, 40-M samples BiCMOS Nyquist ADC in 0.8 mm$^2$", IEEE J.Solid-State Circuits, Vol. 34, no. 12, pp.1796~1802, December 1999, it is well-known that if a random timing error associated with the delay cell in the prior art voltage-controlled delay line 12 is equal to $\tilde{V}$ a random timing error associated with the delay cell in the claimed voltage-controlled delay line 30 then becomes.

Because the timing errors make the periods of the first and second delay clock signals CLK_DL+, CLK_DL– alter continuously, jitters associated to the first and second delay clock signals CLK_DL+, CLK_DL– are generated. Therefore, when the random timing error is reduced to be the original random timing error, a jitter corresponding to the claimed voltage controlled delay line 30 is certainly reduced to be of the original jitter corresponding to the prior art voltage-controlled delay line 12.

In addition, an experimental result of a peak-to-peak jitter corresponding to a worst case associated with adjacent periods shows that the claimed voltage-controlled delay line 30 is capable of greatly reducing jitters. It is noteworthy that the traces connecting the delay cells introduce parasite capacitance to the voltage-controlled delay line 30. Therefore, the circuit layout for the claimed voltage-controlled delay line 30 is designed to make both output ports of one delay cell correspond to the same loading to prevent the traces from being mismatched to affect operation of the claimed voltage-controlled delay line 30.

In contrast to the prior art voltage-controlled delay line, the claimed voltage-controlled delay line either connects a first output port of one delay cell and a second input port of another delay cell where the first output port of one delay cell and the second input port of another delay cell correspond to the same phase, or connects a first input port of one delay cell and a second output port of another delay cell where the first output port of one delay cell and the second input port of another delay cell correspond to the same phase. In other words, the first and second input ports of a delay cell are not simultaneously connected to the corresponding first and second output ports of an adjacent delay cell. The claimed voltage-controlled delay line only alters interconnection among delay cells of the prior art voltage-controlled delay line. Therefore, no additional circuit component is needed. It is easy to implement the desired interconnection within the claimed voltage-controlled delay line, and the timing errors and jitters are greatly reduced to improve performance of the prior art voltage-controlled delay line.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A clock adjustment circuit comprising:
a clock generator for generating a first reference clock signal and a second reference clock signal; and
a voltage controlled delay line for delaying the first reference clock signal by a predetermined delay time to generate a first delay clock signal and delaying the second reference clock signal by the predetermined delay time to generate a second delay clock signal, the first reference clock signal and the first delay clock signal being in phase, the second reference clock signal and the second delay clock signal being in phase, the voltage controlled delay line comprising a plurality of delay cells, each delay cell comprising a first input port, a second input port, a first output port, and a second output port, the delay cells comprising:
a first delay cell, a first input port of the first delay cell electrically connected to the clock generator for receiving the first reference clock signal;
a second delay cell, a first input port of the second delay cell electrically connected to a first output port of the first delay cell through a first input port and a first output port of at least a fifth delay cell, a first output port of the second delay cell electrically connected to a second input port of the first delay cell, a second input port of the second delay cell electrically connected to a second output port of the first delay cell through a first input port and a first output port of at least a sixth delay cell and a second input port and a second output port of at least a fifth delay cell;
a third delay cell, a first input port of the third delay cell electrically connected to the clock generator for receiving the second reference clock signal a second input port of the third delay cell electrically connected to a second output port of the second delay cell; and
a fourth delay cell, a first input port of the fourth delay cell electrically connected to a first output port of the third delay cell through a second output port and a second input port of at least a fifth delay cell and a first output port and a first input port of at least a sixth delay cell, a second input port of the fourth delay cell electrically connected to a second output port of the third delay cell through a second input port and a second output port of at least a sixth delay cell, a first output port of the fourth delay cell used for outputting the first delay clock signal, a second output port of the fourth delay cell used for outputting the second delay clock signal;
wherein a total amount of the fifth delay cells is equal to a total amount of the sixth delay cells.

2. The clock adjustment circuit of claim 1 wherein the first reference clock signal and the second reference clock signal are out of phase, and a period of the first reference clock signal is equal to a period of the second reference clock signal.

3. The clock adjustment circuit of claim 2 wherein the predetermined delay time is equal to the period of the first reference clock signal.

4. The clock adjustment circuit of claim 1 being used in a delay lock loop (DLL).

5. The clock adjustment circuit of claim 1 wherein loading corresponding to a wire connected to a first output port of each delay cell is equal to loading corresponding to a wire connected to a second output port of each delay cell.

6. A clock adjustment circuit comprising:
a clock generator for generating a first reference clock signal and a second reference clock signal;
a voltage controlled delay line for delaying the first reference clock signal by a predetermined delay time to generate a first delay clock signal and delaying the second reference clock signal by the predetermined delay time to generate a second delay clock signal, the first reference clock signal and the first delay clock signal being in phase, the second reference clock signal and the second delay clock signal being in phase, the voltage controlled delay line comprising a 2n delay cells, each delay cell comprising a first input port, a second input port, a first output port, and a second output port, a first input port of a $m^{th}$ delay cell within the 2n delay cells either electrically connected to the clock generator for receiving the first reference clock signal or electrically connected to a first output port of a $(m-1)^{th}$ delay cell, a second input port of the $m^{th}$ delay cell electrically connected to a first output port of a $(n+m-1)^{th}$ delay cell, a first output port of the $m^{th}$ delay cell electrically connected to a first input port of a $(m+1)^{th}$ delay cell, a second output port of the $m^{th}$ delay cell either electrically connected to a second input port of the $(m+1)^{th}$ delay cell or electrically connected to a first input port of a $(n+m+1)^{th}$ delay cell, a first input port of a $(n+m)^{th}$ delay cell either electrically connected to a second output port of the $(m-1)^{th}$ delay cell or electrically connected to the clock generator for receiving the second reference clock signal, a second input port of the $(n+m)^{th}$ delay cell electrically connected to a second output port of the $(n+m-1)^{th}$ delay cell, a first output port of the $(n+m)^{th}$ delay cell electrically connected to a first input port of the $(n+m+1)$th delay cell, electrically connected to a second input port of the $(m+1)^{th}$ delay cell, or used for outputting the first delay clock signal, a second output port of the $(n+m)^{th}$ delay cell electrically connected to a second input port of the $(n+m+1)^{th}$ delay cell or used for outputting the second delay clock signal.

7. The clock adjustment circuit of claim 6 wherein the first reference clock signal and the second reference clock signal are out of phase, and a period of the first reference clock signal is equal to a period of the second reference clock signal.

8. The clock adjustment circuit of claim 7 wherein the predetermined delay time is equal to the period of the first reference clock signal.

9. The clock adjustment circuit of claim 6 being used in a delay lock loop (DLL).

10. The clock adjustment circuit of claim 6 wherein loading corresponding to a wire connected to a first output port of each delay cell is equal to loading corresponding to a wire connected to a second output port of each delay cell.

* * * * *